United States Patent
Dent et al.

(10) Patent No.: US 6,195,399 B1
(45) Date of Patent: Feb. 27, 2001

(54) METHOD AND APPARATUS FOR CONVERTING A WIDEBAND IF SIGNAL TO A COMPLEX (QUADRATURE) BASEBAND SIGNAL

(75) Inventors: Paul W. Dent, Pittsboro; Rajaram Ramesh, Cary; Gregory E. Bottomley, Cary; Richard H. Myers, Raleigh, all of NC (US)

(73) Assignee: Ericsson Inc., Research Traingle Park, NC (US)

( * ) Notice: Subject to any disclaimer, the term of this patent is extended or adjusted under 35 U.S.C. 154(b) by 0 days.

(21) Appl. No.: 08/899,879

(22) Filed: Jul. 24, 1997

Related U.S. Application Data

(63) Continuation-in-part of application No. 08/218,236, filed on Mar. 28, 1994, now Pat. No. 5,841,816, which is a continuation-in-part of application No. 08/965,848, filed on Nov. 7, 1997, now Pat. No. 6,185,619.

(51) Int. Cl.[7] ........................................................ H03D 3/00
(52) U.S. Cl. ........................ 375/322; 455/134; 455/137
(58) Field of Search .................................. 375/322, 348, 375/316, 345; 455/134, 137, 138

(56) References Cited

U.S. PATENT DOCUMENTS

| | | | |
|---|---|---|---|
| 4,584,534 | * 4/1986 | Lijphart et al. | 329/122 |
| 4,873,683 | * 10/1989 | Borth et al. | 370/95.1 |
| 4,888,557 | * 12/1989 | Puckette, IV et al. | 329/341 |
| 5,048,059 | 9/1991 | Dent | 375/94 |
| 5,214,390 | * 5/1993 | Montreuil | 329/309 |
| 5,285,480 | * 2/1994 | Chennakeshu et al. | 375/101 |
| 5,479,453 | 12/1995 | Anvari et al. | 1/10 |
| 5,535,432 | 7/1996 | Dent et al. | 1/40 |

* cited by examiner

*Primary Examiner*—Stephen Chin
*Assistant Examiner*—Mohammad Ghayour
(74) *Attorney, Agent, or Firm*—Burns, Doane, Swecker & Mathis, L.L.P.

(57) ABSTRACT

A wideband radio receiver provides a complex baseband signal by normalizing an IF signal using a limiting amplifier. The normalized IF signal is applied to a complex sampling circuit to provide normalized I and Q components. The limiting amplifier provides an RSSI signal representing the received signal amplitude. The RSSI signal, which is sampled at the same rate as the normalized IF signal, is combined with the normalized I and Q components, to provide I and Q components of the baseband signal.

25 Claims, 3 Drawing Sheets

METHOD AND APPARATUS FOR CONVERTING A WIDEBAND IF SIGNAL TO A COMPLEX (QUADRATURE) BASEBAND SIGNAL

RELATED U.S. APPLICATION DATA

This application is a continuation-in-part of Ser. No. 218,236, filed on Mar. 28, 1994 issued as U.S. Pat. No. 5,841,816, which is a continuation-in-part of Ser. No. 965, 848, filed on Nov. 7, 1997 issued as U.S. Pat. No. 6,185,619.

BACKGROUND

This invention generally relates to the field of radio frequency (RF) receivers and, more particularly, to a method and apparatus for producing complex baseband signals, also known as quadrature baseband signals from a wideband IF signal.

In order to recover modulated information, for example, audio information, radio receivers process received RF signals using well known demodulation techniques, such as frequency, amplitude or phase demodulation techniques. With the advent of powerful digital signal processors (DSPs), modern radio receivers demodulate the received signal more effectively using data processing techniques that rely on numeric representations of the received signal. In order to process a received signal, most digital demodulation techniques produce a complex baseband signal having complex components. These complex components, which are known as inphase (I) and quadrature (Q) components, carry amplitude, phase, and frequency information of the received signal, which allow a receiver's DSP to recover the modulated information by processing the numeric representations of the I and Q components.

There are a variety of known methods for producing the complex components of the received signal. One known method converts a received signal into its complex components by mixing an IF signal with a set of receiver generated reference signals that are 90 degrees out of phase from each other. Separate mixers mix the IF signal with the reference signals, which are also known as sine and cosine signals, to produce a complex baseband signal that comprise the I and Q components of the IF signal.

Generally, the mixers are fabricated using CMOS integrated circuit technology. Because of fabrication mismatches inherent in CMOS technology, the mixers introduce DC offset voltages at their corresponding outputs even when no signal is applied at their inputs. These DC offset voltages could reduce the dynamic ranges of the mixers in a way that adversely affects the digital signal processing resolution. Some conventional receivers include automatic gain control (AGC) circuits at the mixers' inputs to maintain the mixers' outputs within an optimum range. However, because most of the received RF signals are subjected to random variations, generally caused by objects within their propagation paths, the amplification level of the AGC circuits may not be predicted accurately. Therefore, implementation of the AGC circuit in the radio receiver becomes extremely complicated.

Another conventional method relies on phase information contained in a normalized IF signal and the amplitude of the received signal for providing the I and Q components. This Log-polar method is described in U.S. Pat. No. 5,048,059 which is hereby incorporated by reference. After down converting the received signal to an intermediate frequency, a radio receiver incorporating this method limits the IF signal using a limiter that includes cascaded amplification stages, which produce the normalized IF signal at a last amplification stage. At each stage, a detector detects the output levels of its corresponding stage. The output levels from all of the cascaded stages are summed with each other to produce a logarithmic representation of the IF signal amplitude. At the same time, the saturated output at the last stage of the limiter, which has a square waveform containing the phase information, is applied to a phase detector that detects the phase of the normalized IF signal. Based on the phase and amplitude of the IF signal, the receiver's DSP determines the I and Q components by converting the phase and amplitude information from a polar coordinate system to a Cartesian coordinate system.

The phase detector under the conventional method determines phase variations by detecting the durations of the zero-crossings of the normalized IF signal relative to a reference signal. The zero-crossing durations are detected by sampling the normalized IF signal at a predetermined rate, which corresponds to the resolution with which the phase variations are detected. By increasing the sampling rate, the phase detector detects the phase variations with finer resolution. For example, in order to produce a one degree phase resolution, the sampling rate must be 360 times the intermediate frequency. As a result, for producing acceptable phase resolution, the sampling rate under this method is substantially higher than the IF signal frequency.

With the introduction of wide band radio receivers, such as those based on Code Division Multiple Access (CDMA) techniques, the IF signal frequency of a CDMA radio receiver may be in 5–10 MHz range. Therefore, detecting the phase variations of a normalized wide band IF signal using the above described conventional technique requires a high sampling rate that can be provided by a costly high frequency clocking circuit that draws a substantial amount of current. In a battery operated portable radio receiver, which has a limited current source, the high current drain of such a clocking circuit becomes a limiting factor for using the conventional phase detector to provide the I and Q components of a wide band IF signal. Therefore, there exists a need for a cost effective way of producing the I and Q components of a wide band IF signal without drawing the substantial current required by high frequency clocking circuits.

SUMMARY

The present invention that addresses this need is exemplified in a radio receiver that provides a complex baseband signal by producing normalized I and Q components of a received IF signal and by combining the amplitude of the received IF signal with the normalized I and Q components.

According to one aspect of the present invention, a radio receiver receives the received signal and converts it to an IF signal. The radio receiver includes a limiter that provides a normalized IF signal based on the received signal. A quadrature circuit, which in the preferred embodiment of the invention includes a filter and a complex sampling circuit, is coupled to the normalized IF signal for providing the normalized I and Q components thereof. A received signal strength circuit provides a RSSI signal representing the received signal strength. The RSSI signal and the normalized I and Q components are combined by a combiner to produce the complex baseband signal.

According to some of the more detailed features of this aspect of the present invention, the filter in the quadrature circuit, which may be an analog or a digital filter, removes high frequency contents of the normalized IF signal. The complex sampling circuit, preferably, samples the normalized IF signal at a predetermined rate of $4/(2n+1)$ times the frequency of the IF signal, where n is an integer equal to or greater than 0. In this way, the complex sampling circuit provides interleaved normalized I and Q components that are aligned with each other using an alignment circuit. In an exemplary embodiment, the alignment circuit interpolates consecutive I and Q components to provide the normalized I and Q components. The RSSI signal is also sampled at the predetermined rate with the RSSI samples being applied to an AGC circuit to bring the RSSI signal samples within a predefined range. An exemplary combiner is a look up table for providing a numeric representation that correspond to the multiplication of the RSSI signal samples by their corresponding normalized I and Q components.

According to another aspect of the present invention, a method and apparatus for converting an IF signal to a complex baseband signal is disclosed that normalizes the IF signal and determines its amplitude. Based on the normalized IF signal, the method and apparatus of this aspect of the invention produces the normalized I and Q components and combines the amplitude of the IF signal with the normalized I and Q components, to provide the I and Q components of the complex baseband signal.

Other features and advantages of the present invention will become apparent from the following description of the preferred embodiment, taken in conjunction with the accompanying drawings, which illustrate, by way of example, the principles of the invention.

DETAILED DESCRIPTION

Figure 1:
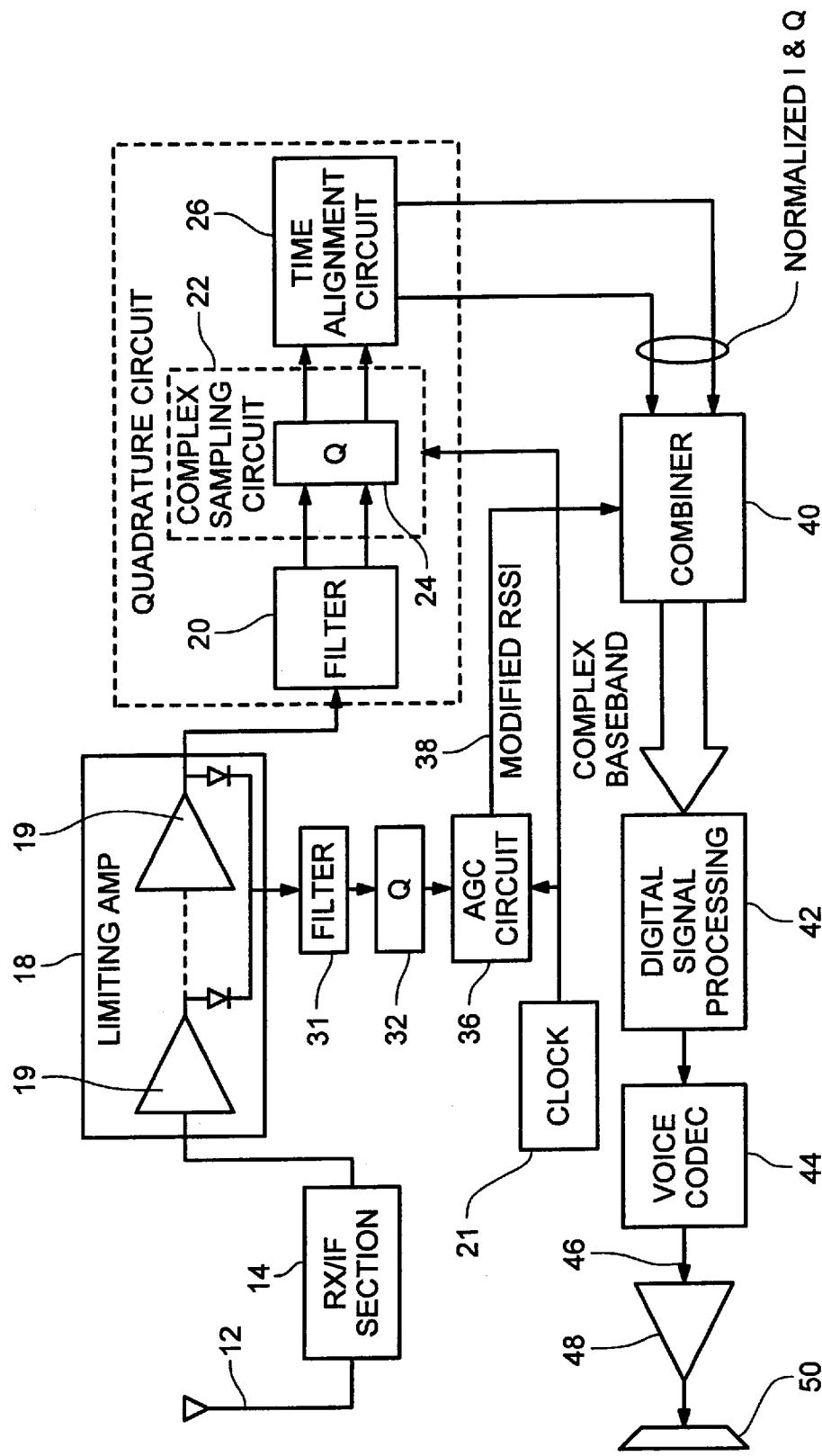
FIG. 1 is a block diagram of a radio receiver according to one embodiment of the present invention.

Referring to FIG. 1, a block diagram of a radio receiver 10 according to one embodiment of the present invention is shown. The radio receiver 10 receives an RF signal via an antenna 12 and applies it to an RX/IF section 14. The received RF signal is suitably modulated with information transmitted from an information source. In an exemplary embodiment, the RF signal is modulated with coded audio information transmitted from a radio transmitter (not shown) operated by a user transmitting voice messages to the radio receiver. The RF/IF section 14, which provides receiver selectivity, down converts the RF signal to provide an IF signal with a predefined intermediate frequency, on line 16.

In an exemplary embodiment, the received RF signal is a CDMA signal having a chip rate of 1.2288 MHz that complies with the Telecommunication Industry Association (TIA) Interim Standard 95 (IS-95 standard). Preferably, the intermediate frequency is selected to be six times the chip rate. For the reasons explained in the background section, it would be appreciated that producing the I and Q components of such wide band IF signal according to the conventional method requires an extremely high sampling rate, to produce a phase signal with adequate resolution. For example, for a conventional phase detector that, relative to a reference signal, provides a 30 degree phase resolution, the timing of zero crossings must be made with a clock of 72 times the chip rate, or about 100 MHz. As described later in detail, instead of determining the phase of the limited IF signal, the radio receiver 10 generates normalized I and Q components by sampling a normalized IF signal at a much lower rate of about 8 times the chip rate, or about 10 MHz. The present invention then combines the normalized I and Q components with the amplitude of the IF signal to produce the I and Q components of the complex baseband signal.

According to the present invention, the IF signal provided by the RF/IF section 14 is applied to a limiting amplifier 18. The limiting amplifier 18 includes a predetermined number of cascaded amplifier stages 19, with each stage having a predefined gain. The gain of the amplifier stages 19 are selected such that stronger IF signals saturate early amplification stages, and weaker IF signals saturate the subsequent amplification stages 19. As a result, the limiting amplifier 18 produces a normalized IF signal that has a square waveform. According to the embodiment shown in FIG. 1, the normalized IF signal is applied to an analog filter 20 to remove its high frequency contents. Consequently, the analog filter 20, which may be a band pass or a low pass filter, converts the square waveform of the normalized IF signal into a sinusoidal signal that contains the phase information of the modulated received signal.

The sinusoidal normalized IF signal at the output of the analog filter 20 is applied to a complex sampling circuit 22 that includes a quantizer 24 that provide numerical representation of the normalized I and Q components. One such complex sampling circuit is described in U.S. Pat. No. 4,888,557 issued to Puckette et al., which is hereby incorporated by reference. Using a clock circuit 21, the complex sampling circuit 22 samples the normalized IF signal at a sampling rate substantially equal to $4/(2n+1)$ times the intermediate frequency, where n is an integer equal to or greater than zero. In the preferred embodiment, the sampling rate of the normalized IF signal is selected to be 4/3 times the intermediate frequency, or 8 times the chip rate. The complex sampling circuit 22 samples the normalized IF signal in a staggered manner such that the quantized and normalized I and Q samples are interleaved. The quantized normalized I and Q samples may include alternate I and Q samples that are negated with respect to each other. For example, the output of the complex sampling circuit may be a sequence of I, –Q (Q bar), –I(I bar), and Q. The present invention adjust for the negated I and Q samples during a subsequent interpolation stage.

The outputs of the quantizer 24 are applied to an alignment circuit 26 for aligning the interleaved normalized I and Q components with each other. The alignment circuit 26 may be an interpolation circuit that aligns the I and Q components by performing a well known interpolation technique. A simple interpolation technique combines two consecutive normalized I components and two consecutive normalized Q components, to compute an I and a Q value at the middle of the center two values, thus time-aligning the interleaved I and Q components with each other. In this way, the output of the alignment circuit 26 comprises the normalized I and Q components of the received signal referenced relative to a common instant in time. As explained above, the time alignment circuit adjust for the negated I and Q samples, as well. Accordingly, the filter 20, the complex sampling circuit 22, and the alignment circuit 26 constitute a quadrature circuit 27 that produces the normalized I and Q components of the normalized IF signal.

At each amplification stage 19, the limiting amplifier 18 includes a number of amplitude detectors, such as diodes 28, that produce a DC signal representing the signal amplitude at the output of a corresponding stage. The outputs of the detectors are summed with each other in a well known manner, to produce a received signal strength indicator (RSSI) signal on line 30, which is a logarithmic representation of the received signal amplitude. The RSSI signal is applied to a sampler/quantizer circuit 32 that, using the clock 21, also samples it at 8 times the chip rate to provide a numerical representation of the received signal at each sampling instance. Because the dynamic range of the RSSI signal may be high, a large number of bits would be needed to represent the quantized RSSI signal, resulting in high power consumption. In order to lower the power consumption, a filter 31 is added before the quantizer 32. The filter 31 essentially performs a differencing operation relative to consecutive samples. Since the RSSI does not change very significantly over short intervals of time (fractions of a bit period), the filter 31 provides an RSSI signal with low dynamic range, which can be quantized with fewer bits.

The quantized RSSI signal, on line 41, is applied to an AGC circuit 36 to provide a modified RSSI signal on line 38. The AGC circuit can re-integrate the RSSI values to compensate for the differencing filter 31. An exemplary AGC circuit 36 performs a substraction of a slowly adapted value from the quantized RSSI signal to maintain it within a desired range. The subtracted value is adapted based on the total power received in the IF bandwidth due to a sum of CDMA signals.

The modified RSSI signal and the normalized I and Q components are applied to a combiner circuit 40 that combines the normalized I and Q components with their corresponding quantized amplitude samples, to provide the I and Q components of the complex baseband signal. In an exemplary embodiment, the combiner circuit 40 includes a lookup table that combines the modified RSSI signal with the normalized I and Q components by outputting a numeric representation that corresponds to the multiplication of the normalized I and Q components by their corresponding RSSI amplitude samples.

The numerically represented I and Q components are applied to a DSP 42 to retrieve the coded audio information using a suitable demodulation data processing technique. The coded audio information is applied to a codec 44 for decoding the coded audio information according to the coding technique used when transmitting the audio information. The codec 44 provides an audio signal on line 46 representing the transmitted audio. The audio signal is applied to an audio amplifier 48, which amplifies the audio signal and presents it to a speaker 50, for rendering an audible sound of the transmitted voice messages.

Figure 2:
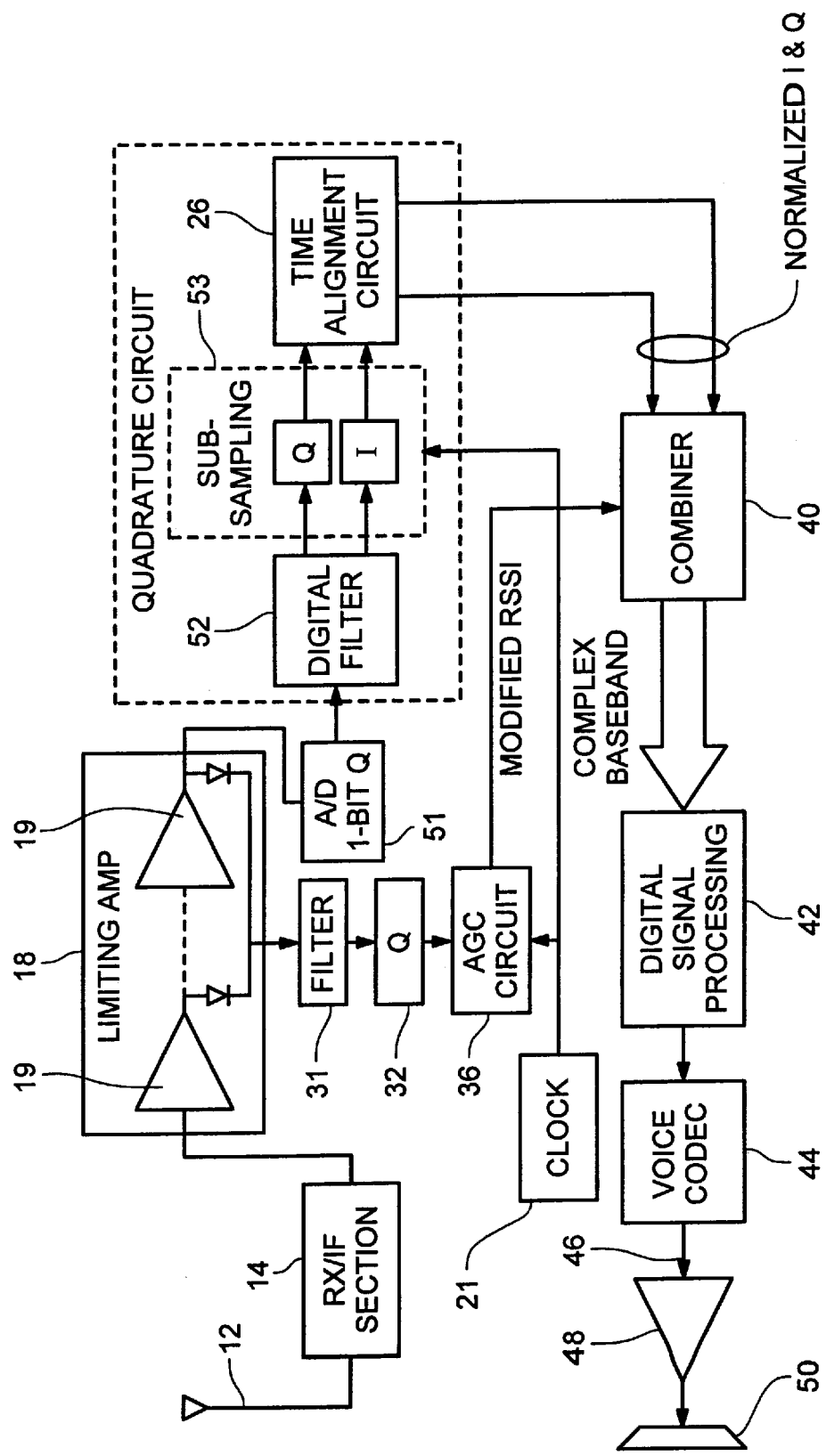
FIG. 2 is a block diagram of a radio receiver according to another embodiment of the present invention.

Referring to FIG. 2, another embodiment of the radio receiver 10 of the present invention is shown. Similar to the embodiment of FIG. 1, the received RF signal after being converted to the IF signal, via the RF/IF section 14, is normalized by the limiting amplifier 18. Because the normalized IF signal at the output of the limiting amplifier 18 has a square wave form, the digital filter 52 uses a one bit quantization technique. Therefore, the normalized IF signal is applied to a 1-bit analog to digital quantizer 51, which provides a sequence of binary states representing the normalized IF signal. According to this embodiment of the invention, however, the output of the quantizer 51 is applied to a digital filter 52 instead of the analog filter 20 of FIG. 1. The digital filter 52 performs the task of removing high frequency contents of the normalized IF signal through well known digital filtering techniques. The digital filter 52 samples the normalized IF signal, to achieve a desired accuracy in producing the sinusoidal representation of the normalized IF signal. After being digitally filtered, the normalized signal is applied to a sub-sampling circuit 53, which depending on the sampling rate selects sub-samples of the normalized IF signal for providing the normalized I and Q components. Thereafter, the normalized I and Q components are processed according to the present invention as described in connection with FIG. 1. Filter 52 may alternatively be a hybrid analog/digital filter, in which the signal is partly analog filtered and then digitized as a ternary (1, 0, −1) sample or to a sample of two bits accuracy. The coarsely quantitized sample is then digitally filtered, thus completing a hybrid filtering operation.

Although a logarithmic amplifier, as incorporated in the limiting amplifier 18, can be made to have an adequate dynamic range, if the amplifier has more than about 50 dB gain it is desirable to split it into gain blocks, with bandpass filters between the blocks in order to limit wideband noise accumulation. The filters then introduce delay such that the detected signal from later detector stages is delayed compared to the detected signal from earlier stages. U.S. Pat. No. 5,070,303 to Dent, which is hereby incorporated by reference, discloses delaying the detected signal from earlier stages to time-align it with that of later stages before combining.

Figure 3:
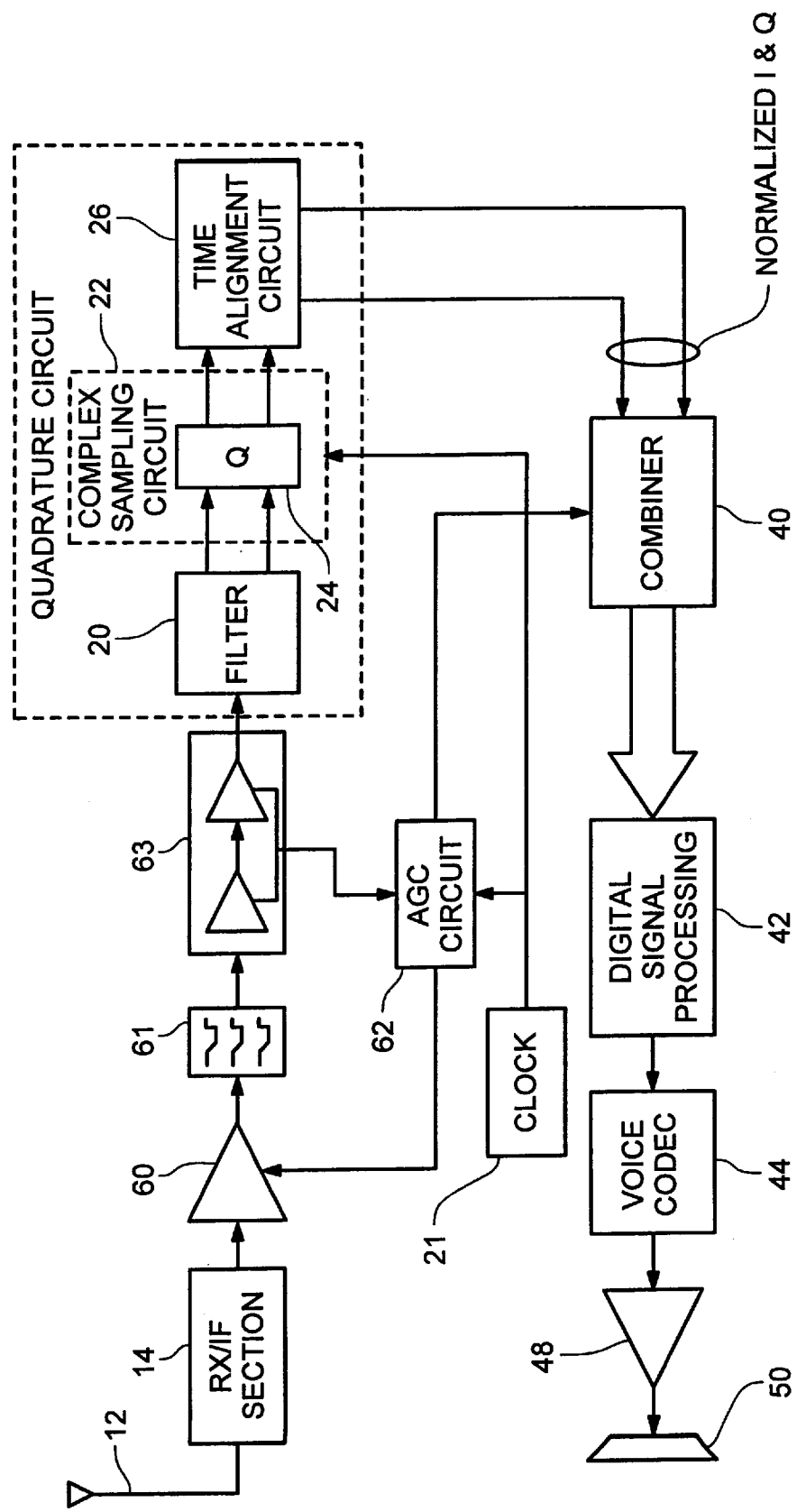
FIG. 3 is a block diagram of a radio receiver according to still another embodiment of the present invention.

Referring to FIG. 3, yet another embodiment of the invention is shown, which uses a feedback AGC to limit dynamic range so that only one IF filter and RSSI amplifier stage is needed, thus avoiding time-alignment to compensate for filter delay. This embodiment is envisaged primarily for continuous reception as when using CDMA. In FIG. 3, the limiting amplifier includes a logarithmic amplifier 63, which is assumed to have lower dynamic range than the total range of signal levels that may be received. Also, under this embodiment, an AGC amplifier 60 and an IF filter 61 are coupled between the RF/IF section 14 and the logarithmic amplifier 63.

The AGC amplifier 60 enables the signal level presented to the logarithmic amplifier 63 to be controlled to an optimum region. An AGC circuit 62 detects whether the RSSI signal from the logarithmic amplifier 63 is greater or less, on average, than the optimum value and applies a control signal to the AGC amplifier 60 accordingly to adjust the signal level toward the optimum value. The AGC is relatively slow in operation compared to the signal bandwidth; the stability of this AGC feedback loop is therefore not impaired by inclusion of the IF filter 61 within the AGC loop.

Thus, the wideband gain, defined as the gain of the logarithmic amplifier 63 between the output of the IF filter 61 and the input to the complex sampling circuit 22 may be reduced to prevent build-up of wideband noise in the logarithmic amplifier 63.

Despite the slowness of the feedback AGC, it is desirable to compensate for its action and thus the AGC circuit 62 preferably first compensates the RSSI signal for the amount of gain reduction applied to the AGC amplifier 60 before reporting the true RSSI for further processing circuitry. The so-compensated RSSI signal is then digitally scaled by means of the aforementioned combination with a slowly adapted constant in order to produce a scaled, digitized amplitude signal to the combiner 40.

The Combiner 40 combines the scaled amplitude signal sample-by sample with the time-aligned, normalized I,Q values from the time alignment circuit 26 in order to re-insert amplitude information into the I,Q values prior to digital signal processing by the DSP 42 to decode the CDMA signal, using for example a RAKE receiver. Using the arrangement of FIG. 3, it is possible to omit the use of the logarithmic amplifier 63 and instead use a linear amplifier/detector. This is possible when the feedback AGC may be relied upon to maintain a relatively constant total signal level at the input of the amplifier. If a linear amplifier is used for amplifier 63, in which instantaneous amplitude variations of the signal are not erased and pass through to combiner 40, it may not be necessary to re-insert the amplitude information removed by the feedback AGC circuit before decoding. Nevertheless, the effect of the feedback AGC on the signal level is still preferably combined with the amplitude information preserved on the I,Q signals in order to determine the true signal strength received. The true signal received is useful to know when comparing alternative sources of a received signal and deciding which source (e.g., base station) to prefer for receiving service.

As claimed below, one aspect of the present invention, therefore, is related to an apparatus for converting an intermediate frequency (IF) signal to a complex baseband signal comprises the following steps:

normalizing circuit that normalizes the IF signal and determines amount of amplitude normalizing applied;

a circuit that produces normalized I and Q components based on the normalized IF signal; and a combiner circuit that combines the normalized I and Q components with amount of amplitude normalizing applied to determine scaled I and Q components with desired amplitude content.

From the foregoing description of the embodiments of the invention it will be appreciated that the present invention does not require detection of the phase of the normalized IF signal, thus, eliminating the need for a high frequency clocking circuit. In this way, the present invention provides a simple method for producing complex baseband signals that are derived from a wideband received signal. As a result, the wideband radio receiver of the invention can cost effectively process the RF received signals without consuming substantial current.

Although the invention has been described in detail with reference only to the presently preferred embodiment, those skilled in the art will appreciate that various modifications can be made without departing from the invention. Accordingly, the invention is defined only by the following claims which are intended to embrace all equivalents thereof.

What is claimed is:

1. A radio receiver for receiving a received signal, comprising:

a limiter that provides a normalized signal based on the received signal;

a quadrature circuit coupled to the normalized signal for providing normalized in-phase (I) and (Q) quadrature components of the normalized signal;

a received signal strength circuit that provides a received signal strength indicator (RSSI) signal representing the received signal strength;

a quantizer for digitizing said RSSI signal;

an automatic gain control circuit for subtracting a value from said quantized RSSI signal to generate a modified RSSI signal;

a combiner for combining the modified RSSI signal with the normalized I and Q components.

2. The radio receiver of claim 1, wherein the quadrature circuit includes a filter for removing high frequency contents of the normalized signal.

3. The radio receiver of claim 2, wherein the filter is a digital filter.

4. The radio receiver of claim 1, wherein the quadrature circuit includes a complex sampling circuit that samples the normalized signal at a predetermined rate.

5. The radio receiver of claim 4, wherein the complex sampling circuit samples the normalized signal at a sampling rate of $4/(2n+1)$ times the frequency of the normalized signal, where n is an integer equal to or greater than 0.

6. The radio receiver of claim 4, wherein the complex sampling circuit provides interleaved normalized I and Q components.

7. The radio receiver of claim 6, wherein the quadrature circuit includes an alignment circuit for aligning the interleaved normalized I and Q components.

8. The radio receiver of claim 7, wherein the alignment circuit interpolates the interleaved normalized I and Q components, to provide the normalized I and Q components.

9. The radio receiver of claim 4, further including a sampler circuit that samples RSSI signal at the predetermined sampling rate.

10. The radio receiver of claim 9, further comprising an automatic gain control (AGC) circuit for bringing the RSSI signal samples within a predefined range.

11. The radio receiver of claim 10, wherein the combiner is a look up table for providing a numeric representation that corresponds to the multiplication of the RSSI signal samples by their corresponding normalized I and Q components.

12. An apparatus for converting an intermediate frequency (IF) signal to a complex baseband signal, comprising:

normalizing circuit that normalizes the IF signal and determines amount of amplitude normalizing applied;

a circuit that produces normalized I and Q components based on the normalized IF signal, including an alignment circuit that aligns the normalized I and Q components with each other by interpolating consecutive I and Q components; and a combiner circuit that combines the normalized I and Q components with amount of amplitude normalizing applied to determine scaled I and Q components with desired amplitude content.

13. The apparatus of claim 12, wherein the normalizing circuit is a limiting amplifier.

14. The apparatus of claim 12, wherein the normalizing circuit is a feedback automatic gain amplifier.

15. The apparatus of claim 12, wherein the circuit that produces the normalized I and Q components includes a filter for removing the high frequency contents of the normalized IF signal.

16. The apparatus of claim 12, wherein the circuit that produces the normalized I and Q components includes a complex sampling circuit that samples the normalized IF signal at a predetermined rate.

17. The apparatus of claim 16, wherein the predetermined sampling rate is $4/(2n+1)$ times the frequency of the IF signal, where n is an integer greater than or equal to 0.

18. The apparatus of claim 16, wherein the complex sampling circuit produces interleaved normalized I and Q components.

19. A method for converting an IF signal to a complex baseband signal, comprising:

normalizing the IF signal and determining its amplitude;

producing normalized I and Q components based on the normalized IF signal;

aligning the normalized I and Q components with each other by interpolating consecutive I and Q components; and combining the amplitude of the IF signal with the normalized I and Q components.

20. The method of claim 19, wherein the IF signal is normalized by a limiting amplifier.

21. The method of claim 19, wherein the normalized IF signal is filtered for removing its high frequency contents.

22. The method of claim 19, wherein the normalized I and Q components are produced by complex sampling of the IF signal at a predetermined sampling rate.

23. The method of claim 22, wherein the predetermined sampling rate is 4/(2n+1) times the frequency of the IF signal, where n is an integer greater than or equal to 0.

24. The method of claim 22, wherein the complex sampling produces interleaved normalized I and Q components.

25. The radio receiver of claim 1, where said value is adapted based on a total power received in an IF bandwidth of said received signal.

* * * * *